(12) United States Patent
Gao et al.

(10) Patent No.: US 12,439,517 B2
(45) Date of Patent: Oct. 7, 2025

(54) CIRCUIT BOARD STRUCTURE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Liang Gao, Beijing (CN); Ajuan Du, Beijing (CN); Bin Wang, Beijing (CN); Xuerui Gong, Beijing (CN); Enjian Yang, Beijing (CN); Hufei Yang, Beijing (CN); Hao Sun, Beijing (CN); Yang Wang, Beijing (CN); Feifan Li, Beijing (CN); Xiaoxia Huang, Beijing (CN); Yongle Wang, Beijing (CN); Yiqian Wu, Beijing (CN); Yilun Zeng, Beijing (CN); Guodong Zeng, Beijing (CN); Fengping Wu, Beijing (CN)

(73) Assignees: Chengdu BOE Optoelectronics Technology Co., Ltd., Sichuan (CN); BOE Technology Group Co., Ltd., Sichuan (CN)

( * ) Notice: Subject to any disclaimer, the term of this patent is extended or adjusted under 35 U.S.C. 154(b) by 0 days.

(21) Appl. No.: 18/025,180

(22) PCT Filed: Sep. 27, 2021

(86) PCT No.: PCT/CN2021/121102
§ 371 (c)(1),
(2) Date: Mar. 7, 2023

(87) PCT Pub. No.: WO2023/044930
PCT Pub. Date: Mar. 30, 2023

(65) Prior Publication Data
US 2024/0284596 A1      Aug. 22, 2024

(51) Int. Cl.
  *H05K 1/14*   (2006.01)
  *H05K 1/02*   (2006.01)

(52) U.S. Cl.
  CPC ............. *H05K 1/142* (2013.01); *H05K 1/028* (2013.01); *H05K 2201/0195* (2013.01);
  (Continued)

(58) Field of Classification Search
  None
  See application file for complete search history.

(56) References Cited

U.S. PATENT DOCUMENTS 4,737,208 A * 4/1988 Bloechle ............. H01L 21/4857
                                                                156/289
4,849,284 A * 7/1989 Arthur ..................... C08K 9/06
                                                                428/405

(Continued)

FOREIGN PATENT DOCUMENTS

CN      205912327 U    1/2017
CN      111580699 A    8/2020
(Continued)

OTHER PUBLICATIONS

International Search Report issued in Application No. PCT/CN2021/121102, dated May 25, 2022, with English translation. (4p).
(Continued)

*Primary Examiner* — Timothy J Thompson
*Assistant Examiner* — John B Freal
(74) *Attorney, Agent, or Firm* — Arch & Lake LLP

(57) ABSTRACT

A circuit board structure and a display device, the circuit board structure includes a first circuit board, a second circuit board, a filling portion and an electromagnetic shield layer. The second circuit board has a thickness greater than that of the first circuit board. At least one corner portion forms at a joint of the first circuit board and the second circuit board.

(Continued)

A connection line forms at a joint of the second circuit board and the first circuit board. The connection line is located at the corner portion. The filling portion fills the corner portion, an extending direction of the filling portion is identical to an extending direction of the corner portion. The extending direction is identical to a direction of the connection line. A thickness of a cross section of the filling portion perpendicular to the extending direction increases as a distance from the second circuit board decreases.

20 Claims, 7 Drawing Sheets

(52) U.S. Cl.
CPC ............... *H05K 2201/0206* (2013.01); *H05K 2201/0338* (2013.01); *H05K 2201/0715* (2013.01); *H05K 2201/09036* (2013.01)

(56) References Cited

U.S. PATENT DOCUMENTS

| | | | |
|---|---|---|---|
| 2005/0046510 A1* | 3/2005 | Kerner | H01Q 23/00 333/33 |
| 2006/0118804 A1* | 6/2006 | Nagai | H10H 20/8506 257/E33.072 |

FOREIGN PATENT DOCUMENTS

| | | |
|---|---|---|
| CN | 111599272 A | 8/2020 |
| WO | 2021227727 A1 | 11/2021 |
| WO | 2021233001 A1 | 11/2021 |

OTHER PUBLICATIONS

Written Opinion of Tiie International Searching Authority, issued in Application No. PCT/CN2021/121102, with English translation. (3p).

* cited by examiner

CIRCUIT BOARD STRUCTURE AND DISPLAY DEVICE

CROSS REFERENCE

The present application is a U.S. National Stage of International Application No. PCT/CN2021/121102, filed on Sep. 27, 2021, the contents of all of which are incorporated herein by reference in their entireties for all purposes.

TECHNICAL FIELD

The present disclosure relates to the field of display technology, and specifically, to a circuit board structure and a display device including the same.

BACKGROUND

With the increasing demand for thinness, lightness, duration performance, etc. of electronic products by consumers, multilayer FPC (Flexible Printed Circuit) has arisen. However, the application of the multilayer board to electronic products causes undesirable consequence of reduced electromagnetic shielding performance of the electronic products.

It should be noted that the information disclosed in the background technology section above is only for the purpose of enhancing the understanding of the background of this disclosure, and therefore may include information that does not constitute prior art known to those of ordinary skill in the art.

SUMMARY

The present disclosure provides a circuit board structure and a display device including the same.

According to an aspect of the present disclosure, there is provided a circuit board structure, including:
  a first circuit board;
  a second circuit board, connected to the first circuit board, wherein a thickness of the second circuit board is greater than that of the first circuit board, at least one corner portion forms at a joint of the first circuit board and the second circuit board, a connection line forms at a joint of the second circuit board and the first circuit board, the connection line is located at the corner portion;
  a filling portion, filling in the corner portion, wherein an extending direction of the filling portion is identical to an extending direction of the corner portion, the extending direction is identical to a direction of the connection line, a thickness of a cross section of the filling portion perpendicular to the extending direction increases as a distance from the second circuit board decreases; and
  an electromagnetic shielding layer, covering the first circuit board, the second circuit board and the filling portion.

In an example embodiment of the present disclosure, a side of the filling portion away from the first circuit board and away from the second circuit board is a column surface, the column surface is recessed toward a side close to the corner portion, smooth transition exists between the column surface and the first circuit board.

In an example embodiment of the present disclosure, a width of an orthographic projection of the filling portion on the first circuit board in a first direction is less than or equal to one-half of a width of the first circuit board in the first direction, a length of the filling portion in a second direction is equal to a length of the corner portion in the second direction, a height of the filling portion in a third direction is less than or equal to a distance between a first surface of the second circuit board and a first surface of the first circuit board, the first surface of the first circuit board is a surface with the filling portion formed thereon, the first surface of the second circuit board is parallel to the first surface of the first circuit board and is a surface close to the filling portion, the first direction, the second direction and the third direction are perpendicular to each other.

In an example embodiment of the present disclosure, a recessed portion exists on a surface of the first circuit board with the corner portion formed thereon and close to an end of the second circuit board, the recessed portion is connected with the corner portion, the filling portion fills the corner portion and the recessed portion.

In an example embodiment of the present disclosure, the first circuit board has a bending area, wherein an orthographic projection of a side edge of the filling portion away from the second circuit board on the first circuit board is located in the bending area, and the orthographic projection of the edge on the first circuit board is a curve.

In an example embodiment of the present disclosure, the curve includes at least one of a line segment and a smooth curve.

In an example embodiment of the present disclosure, the filling portion includes:
  a filling portion body;
  a plurality of protrusions, successively arranged on a side of the filling portion body away from the second circuit board, an orthographic projection of the protrusions on the first circuit board is located in the bending area, an orthographic projection of a side edge of the protrusions away from the second circuit board on the first circuit board forms at least part of the curve, a gap is provided between adjacent two protrusions, a width of each protrusion in a second direction is identical.

In an example embodiment of the present disclosure, material of the filling portion is insulating ink.

In an example embodiment of the present disclosure, the first circuit board is a double-layer board, the first circuit board includes:
  a substrate layer;
  two conductive layers, correspondingly laminated on opposite two sides of the substrate layer;
  an adhesive layer, provided in two layers, the two adhesive layers correspondingly provided on two sides of the conductive layer away from the substrate layer;
  an insulating layer, provided in two layers, the two insulating layers correspondingly provided on two sides of the adhesive layer away from the substrate layer.

In an example embodiment of the present disclosure, the second circuit board includes:
  a first double-layer circuit board;
  two first adhesive layers, correspondingly laminated on opposite two sides of the first double-layer circuit board;
  a second double-layer circuit board, symmetrically provided in two, the two second double-layer circuit boards correspondingly provided on two sides of the first adhesive layer away from the first double-layer circuit board.

In an example embodiment of the present disclosure, the two conductive layers are correspondingly provided in an identical layer with two conductor layers in the first double-layer circuit board, the corner portion and the filling portion are provided in two.

In an example embodiment of the present disclosure, an end of the adhesive layer close to the second circuit board and an end of the insulating layer close to the second circuit board are located between the first adhesive layer and the first double-layer circuit board.

In an example embodiment of the present disclosure, the two conductive layers are correspondingly provided in an identical layer with two conductor layers in one of the second double-layer circuit boards, the corner portion and the filling portion are provided in one.

In an example embodiment of the present disclosure, a first end of the adhesive layer and a first end of the insulating layer are located between the first adhesive layer and the second double-layer circuit board, the first end of the adhesive layer is an end close to the corner portion and close to the second circuit board, the first end of the insulating layer is an end close to the corner portion and close to the second circuit board, the adhesive layer away from the corner portion and a third adhesive layer in the second double-layer circuit board are provided in an identical layer and connected as a whole, and the insulating layer away from the corner portion and a first insulating cover layer of the second double-layer circuit board are provided in an identical layer and connected as a whole.

In an example embodiment of the present disclosure, the second circuit board includes:
 a first double-layer circuit board, laminatedly provided in two;
 a first adhesive layer, bonded between the two first double-layer circuit boards;
 a second adhesive layer, provided in two, the two second adhesive layers correspondingly provided on two sides of the first double-layer circuit board away from the first adhesive layer;
 a single-layer circuit board, symmetrically provided in two, the two single-layer circuit boards correspondingly provided on two sides of the second adhesive layer away from the first adhesive layer.

In an example embodiment of the present disclosure, the two conductive layers are correspondingly provided in an identical layer with two conductor layers in one of the first double-layer circuit boards, the corner portion and the filling portion are provided in two.

In an example embodiment of the present disclosure, one end of one of the adhesive layers close to the second circuit board and one end of one of the insulating layers close to the second circuit board are located between the first adhesive layer and the first double-layer circuit board, and one end of another one of the adhesive layers close to the second circuit board and one end of another one of the insulating layers close to the second circuit board are located between the second adhesive layer and the first double-layer circuit board.

In an example embodiment of the present disclosure, the first double-layer circuit board includes.
 a first substrate layer;
 two first conductive layers, correspondingly laminated on opposite two sides of the first substrate layer.

In an example embodiment of the present disclosure, the second double-layer circuit board includes:
 a second substrate layer.
 two second conductive layers, correspondingly laminated on opposite two sides of the second substrate layer, wherein one of the second conductive layers is bonded to the first adhesive layer;
 a third adhesive layer, provided on a side of the second conductive layer away from the first double-layer circuit board, away from the first double-layer circuit board;
 a first insulating cover layer, provided on a side of the third adhesive layer away from the first double-layer circuit board.

In an example embodiment of the present disclosure, the single-layer circuit board includes:
 a third substrate layer, bonded to the second adhesive layer;
 a third conductive layer, provided on a side of the third substrate layer away from the first double-layer circuit board;
 a fourth adhesive layer, provided on a side of the third conductive layer away from the first double-layer circuit board;
 a second insulating cover layer, provided on a side of the fourth adhesive layer away from the first double-layer circuit board.

According to another aspect of the present disclosure, there is provided a display device, including any of the circuit board structures described above.

It should be understood that the above general description and the later detailed description are only exemplary and explanatory and do not limit the present disclosure.

BRIEF DESCRIPTION OF THE DRAWINGS

The accompanying drawings, which are incorporated in and constitute a part of this specification, illustrate embodiments consistent with the disclosure and serve to explain the principles of the disclosure together with the description. The drawings in the following description are only some embodiments of the present disclosure, and for those of ordinary skill in the art, other drawings can also be obtained from these drawings without creative effort.

NUMERAL REFERENCES

Figure 1:
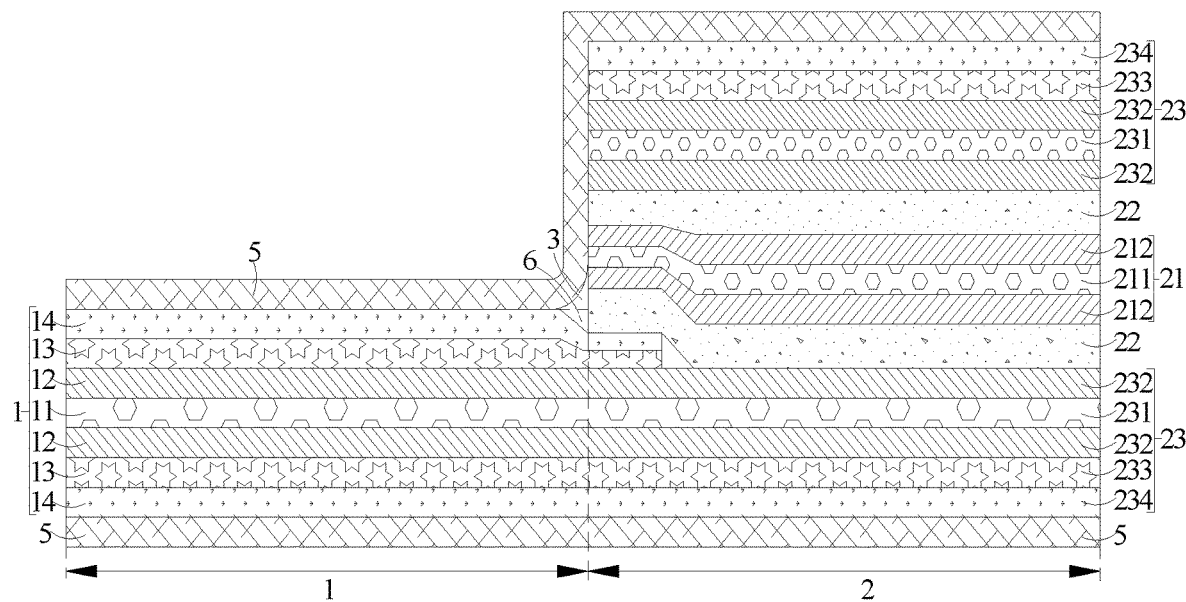
FIG. 1 is a structural schematic diagram of the circuit board structure in the related art.

1, first circuit board; 11, substrate layer; 12, conductive layer; 13, adhesive layer; 14, insulating layer;
2, second circuit board;
21, first double-layer circuit board; 211, first substrate layer; 212, first conductive layer;
22, first adhesive layer;
23, second double-layer circuit board; 231, second substrate layer; 232, second conductive layer; 233, third adhesive layer; 234, first insulating cover layer;
24, second adhesive layer;
25, single-layer circuit board; 251, third substrate layer; 252, third conductive layer; 253, fourth adhesive layer; 254, second insulating cover layer;
3, corner portion;
4, filling portion; 41, first filling portion; 42, second filling portion; 43, filling portion body; 44, protrusion;
5, electromagnetic shielding layer; 6, recessed portion; 7, binding area; 8, component area; and 9, bending area.

DETAILED DESCRIPTION

Example embodiments will now be described more fully with reference to the accompanying drawings. Example embodiments, however, can be embodied in various forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. In addition, the accompanying drawings are only schematic illustrations of the present disclosure and are not necessarily drawn to scale.

Although relative terms such as "on" and "below" are used in this specification to describe the relative relationship of one component of an icon to another component, these terms are used in this specification only for convenience, such as according to the direction of the example described in the drawings. It will be appreciated that if the device of the icon is turned upside down, the components described as "on" will become the components on "below". When a certain structure is "on" other structures, it may mean that a certain structure is integrally formed on other structures, or that a certain structure is "directly" arranged on other structures, or that a certain structure is "indirectly" arranged on another structure through another structure.

The terms "a", "an", "the", "said" and "at least one" are used to indicate the presence of one or more elements/components/etc.; the terms "including" and "having" are used to indicate open-ended inclusive means and means that additional elements/components/etc. may be present in addition to the listed elements/components/etc.; the terms "first", "second", and "third" etc. are used only as labels, not to limit the numbers of the objects.

The inventor found that more and more customers use the structure of double-layer FPC combined with multilayer FPC in their products. However, the height difference is formed at the joint of double-layer FPC and multilayer FPC. The electromagnetic shielding layer covering the multilayer FPC and single-layer FPC is set as a whole sheet, and the electromagnetic shielding layer is prone to be broken at the location where the height difference is formed, which results in the undesirable consequence of reduced electromagnetic shielding performance of electronic products.

Referring to FIG. 1, in the related technology, the first circuit board 1 can be a double-layer FPC and the second circuit board 2 can be a multilayer FPC. Since the first circuit board 1 is thin and the second circuit board 2 is thick, there is a height difference (segment difference) at the joint of the first circuit board 1 and the second circuit board 2, so that there is a corner portion 3 and a recessed portion 6 formed at the joint. After the electromagnetic electromagnetic shielding layer 5 is covered on the first circuit board and the second circuit board, the electromagnetic shielding layer 5 cannot be filled into corners of the recessed portion 6 and the corner portion 3. Since the electromagnetic shielding layer 5 is set in a whole sheet, and the electromagnetic shielding layer 5 has a limited ability to absorb the height difference, the electromagnetic shielding layer 5 is prone to be broken in the corner portion during manufacturing, transportation and other processes, thereby affecting the shielding performance of the circuit board and ultimately affecting the display effect of the display device.

This example implementation of the disclosure provides a circuit board structure. With reference to FIGS. 2-12, the circuit board structure may include a first circuit board 1, a second circuit board 2, a filling portion 4 and an electromagnetic shielding layer 5. The second circuit board 2 is connected to the first circuit board 1. A thickness of the second circuit board 2 is greater than that of the first circuit board 1. At least one corner portion 3 forms at a joint of the first circuit board 1 and the second circuit board 2. A connection line forms at a joint of the second circuit board 2 and the first circuit board 1. The connection line is located at the corner portion 3. The filling portion 4 fills in the corner portion 3. An extending direction of the filling portion 4 is identical to an extending direction of the corner portion 3. The extending direction is identical to a direction of the connection line. A thickness of a cross section of the filling portion 4 perpendicular to the extending direction increases as a distance from the second circuit board 2 decreases. An electromagnetic shielding layer 5 covers the first circuit board 1, the second circuit board 2 and the filling portion 4.

The "connection line" formed at the joint between the first circuit board 1 and the second circuit board 2 in the embodiment of the present disclosure may be a straight line or curve formed by intersection of the surface of the first circuit board 1 in the direction perpendicular to the thickness with the second circuit board 2.

In the circuit board structure of the present disclosure, a filling portion 4 fills in the corner portion 3. A thickness of a cross section of the filling portion 4 perpendicular to its extending direction increases as a distance from the second circuit board 2 decreases. Therefore, the transition between the first circuit board 1 and the second circuit board 2 is gentle. That is, the filling portion 4 forms a transition bridge, making the electromagnetic shielding layer 5 covering the first circuit board 1, the second circuit board 2 and the filling portion 4 gentle, and the filling portion 4 provides support for the electromagnetic shielding layer 5, avoiding the electromagnetic shielding layer 5 from breaking due to the height difference, thus ensuring the electromagnetic shielding performance.

It should be noted that the length direction mentioned below is consistent with the first direction X, the width direction is consistent with the second direction Y, and the thickness direction and the height direction are consistent with the third direction Z. The extending direction of the corner portion 3 and the extending direction of the filling portion 4 are consistent with the second direction Y.

Figure 2:
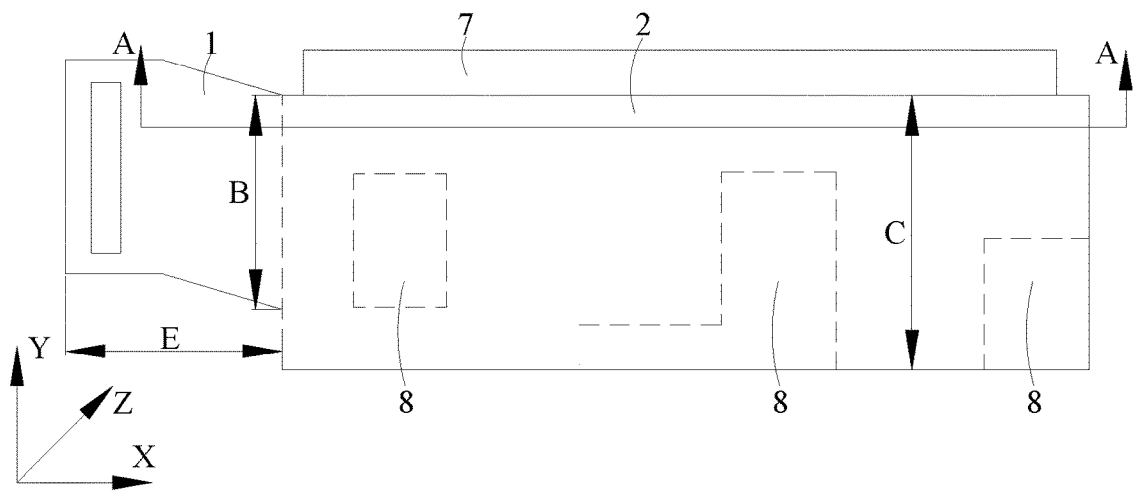
FIG. 2 is a structural schematic diagram of the circuit board structure of the present disclosure.

Referring to FIG. 2, one side of the first circuit board 1 is connected to one side of the second circuit board 2, and the width B of the first circuit board 1 is less than the width C of the second circuit board 2, then the width of the formed corner portion is equal to the width B of the first circuit board 1. In other example embodiments of the present disclosure, it is also possible that the width B of the first circuit board 1 is greater than the width C of the second circuit board 2, so that the width of the formed corner portion 3 is equal to the width C of the second circuit board 2. That is, the width of the corner section 3 is equal to the side length of the connecting side of the circuit board with the shorter connecting side.

In this example implementation, the first circuit board 1 can be a double-layer board. The first circuit board 1 can include a substrate layer 11, two layers of conductive layer 12, two layers of adhesive layers 13, and two layers of insulating layers 14. The first circuit board 1 may also be a single-layer board, a three-layer board, or a board with more layers. As long as the thickness of the first circuit board 1 is smaller than the thickness of the second circuit board 2, the corner portion will be formed at the joint of the first circuit board 1 and the second circuit board 2. The following is a detailed description of the first circuit board 1 as a double-layer board.

Referring to FIGS. 3-12, specifically, the material of the substrate layer 11 may be PI (polyimide), and the substrate layer 11 has a first surface and a second surface that are opposite. Two layers of conductive layer 12 are laminated on opposite sides of the substrate layer 11 in one-to-one correspondence. That is, one layer of conductive layer 12 is set on the first surface of the substrate layer 11, and another layer of conductive layer 12 is set on the second surface of the substrate layer 11. The material of the conductive layer 12 can be copper, or can also be other conductive materials, for example, silver, gold, aluminum and so on. Two layers of adhesive layer 13 are provided on two sides of the conductive layer 12 away from the substrate layer 11 in one-to-one correspondence, and the adhesive layer 13 is provided on the side of the two layers of conductive layer 12 away from the substrate layer 11. The two layers of insulation layer 14 are provided on two sides of the adhesive layer 13 away from the substrate layer 11 in one-to-one correspondence, and the insulation layer 14 is provided on the side of the two layers of adhesive layer 13 away from the substrate layer 11. The material of the insulation layer 14 can be is PI (polyimide).

The second circuit board 2 can be a six-layer board. The second circuit board 2 can also be a two-layer board, a three-layer board, a four-layer board, a five-layer board, a seven-layer board or a board with more layers, as long as the thickness of the second circuit board 2 can be greater than the thickness of the first circuit board.

The following is a detailed description of the second circuit board 2 through two example implementations.

Figure 3:
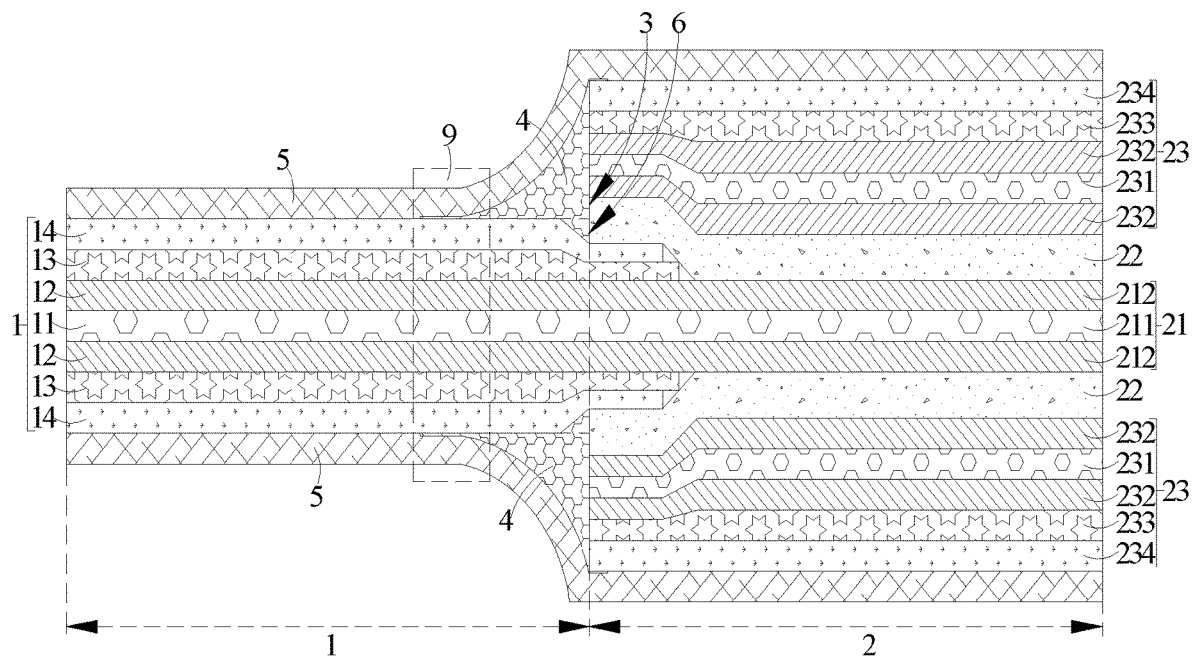
FIG. 3 is a structural schematic diagram of a first example embodiment of the circuit board structure after cutting along A-A in FIG. 2.
Figure 4:
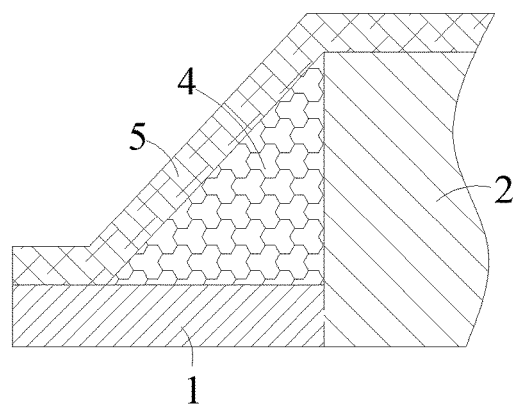
FIG. 4 is a structural schematic diagram of the filling portion of another example embodiment.
Figure 5:
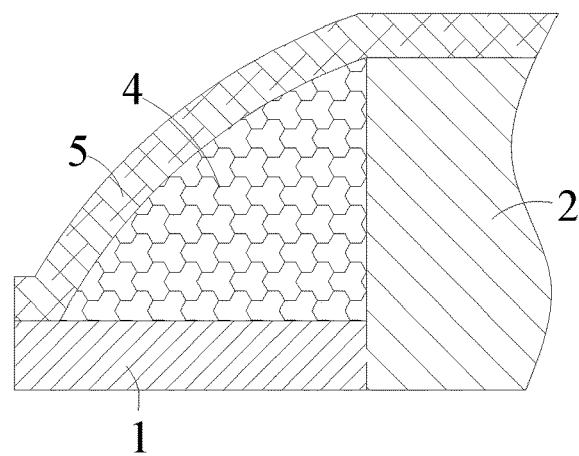
FIG. 5 is a structural schematic diagram of the filling portion of yet another example embodiment.

Referring to FIGS. 3-5, the second circuit board 2 can include a first double-layer circuit board 21, two layers of first adhesive layer 22 and two second double-layer circuit board 23. The two layers of first adhesive layer 22 are laminated on opposite two sides of the first double-layer circuit board 21 in one-to-one correspondence. That is, one layer of first adhesive layer 22 is provided on one side of the first double-layer circuit board 21, another layer of first adhesive layer 22 is provided on the opposite side of the first double-layer circuit board 21. The second double-layer circuit board 23 is provided on the side of the first adhesive layer 22 away from the first double-layer circuit board 21. A second double-layer circuit board 23 is provided on the sides of two layers of first adhesive layer 22 away from the first double-layer circuit board 21. That is, the second circuit board 2 is provided in a sequence of layers of the second double-layer circuit board 23, the first adhesive layer 22, the first double-layer circuit board 21, the first adhesive layer 22, and the second double-layer circuit board 23.

Specifically, the first double-layer circuit board 21 can include a first substrate layer 211 and two layers of first conductive layer 212. The first substrate layer 211 has a first surface and a second surface that are opposite. The two layers of first conductive layer 212 are laminated on opposite two sides of the first substrate layer 211 in one-to-one correspondence. That is, a layer of first conductive layer 212 is provided on the first surface, and a layer of first conductive layer 212 is also provided on the second surface.

The second double-layer circuit board 23 can include a second substrate layer 231, a third adhesive layer 233, a first insulating cover layer 234 and two layers of second conductive layer 232.

The second substrate layer 231 has a first surface and a second surface that are opposite. The two layers of second conductive layer 232 are laminated on opposite two sides of the second substrate layer 231 in one-to-one correspondence. That is, a layer of second conductive layer 232 is provided on the first surface, and a layer of second conductive layer 212 is also provided on the second surface. The second conductive layer 232 close to the first double-layer circuit board 21 is bonded with the first adhesive layer 22, thus bonding the second double-layer circuit board 23 and the first double-layer circuit board 21 together.

The third adhesive layer 233 is provided on the side of the second conductive layer 232 away from the first double-layer circuit board 21, away from the first double-layer circuit board 21. That is, the third adhesive layer 233 is provided in only one layer. The third adhesive layer 233 is only provided on the side of the second conductive layer 232 away from the first double-layer circuit board 21. The first insulating cover layer 234 is provided on the side of the third adhesive layer 233 away from the first double-layer circuit board 21. That is, the first insulating layer 234 is bonded with the second conductive layer 232 together through the third adhesive layer 233.

Referring to FIG. 3, two layers of conductive layer 12 of the first circuit board 1 are provided in the same layer as the conductor layers in the first double-layer circuit board 21 in one-to-one correspondence. That is, one layer of conductive layer 12 in the first circuit board 1 is provided in the same layer as one layer of first conductive layer 212 in the first double-layer circuit board 21, and another layer of conductive layer 12 in the first circuit board 1 is provided in the same layer as another layer of first conductive layer 212 in the first double-layer circuit board 21. The substrate layer 11 of the first circuit board 1 and the first substrate layer 211 of the first double-layer circuit board 21 are also provided in the same layer.

The end of the adhesive layer 13 close to the second circuit board 2 and the end of the insulating layer 14 close to the second circuit board 2 are located between the first adhesive layer 22 and the first double-layer circuit board 21. That is, the orthographic projection of the adhesive layer 13 on the substrate layer 11 and the orthographic projection of the insulating layer 14 on the substrate layer 11 overlap with the orthographic projection of the first adhesive layer 22 on the substrate layer 11. The width of the overlapping area is about 0.5 mm.

Two corner portions 3 are formed at the joint of the first circuit board 1 and the second circuit board 2, and the two corner portions 3 are located on opposite two sides of the first circuit board 1. Since the two second double-layer circuit boards 23 located on opposite two sides of the first double-layer circuit board 21 are symmetrical, the two corner portions 3 are also substantially symmetrical. The corner portion 3 can be a right-angle corner portion, and can also be an obtuse-angle corner portion or an acute-angle corner portion.

It should be noted that "symmetry" mentioned above and below is not completely symmetrical, but refers to that the number of layers of the symmetrical two circuit boards are the same, and the locations of the conductive layer and insulating layer are symmetrical to each other, but the thickness of each layer may be the same or different, and even if the two conductive layers are symmetrical, the conductive pattern may be the same or different.

Besides, since the insulating layer 14 and the adhesive layer 13 of the first circuit board 1 need to be formed between the first adhesive layer 22 and the first double-layer circuit board 21 by pressing, a recessed portion 6 is formed on the surface of the first circuit board 1 formed with a corner portion 3 and close to the end of the second circuit board 2. The recessed portion 6 and the corner portion 3 are connected as a whole. That is, one recessed portion 6 is further formed at the corner of the corner portion 3 and close to a side of the second circuit board 2. The corner portion 3 also includes a recessed portion 6. The filling portion 4 fills the corner portion 3 and the recessed portion 6. The extending direction of the recessed portion 6 is the same as the extending direction of the corner portion 3, and the extension length of them two is the same. The cross-sectional shape of the recessed portion 6 perpendicular to its extending direction is basically triangular, but the depth of the recessed portion 6 is small, which is about 20 um.

The corner portion 3 is filled with a filling portion 4, and the extending direction of the filling portion 4 is the same as the extending direction of the corner portion 3. The thickness of a cross section of the filling portion 4 perpendicular to the extending direction increases as a distance from the second circuit board decreases.

The filling portion 4 fills the corner portion 3, such that the transition of the joint between the first circuit board 1 and the second circuit board 2 is gentle. That is, the filling portion 4 forms a transition bridge, making the electromagnetic shielding layer 5 covering the first circuit board 1, the second circuit board 2 and the filling portion 4 gentle, and avoiding the electromagnetic shielding layer 5 from breaking due to the height difference, thus ensuring the electromagnetic shielding performance.

The shape of the cross section of the filling portion 4 perpendicular to its extending direction is substantially the same as the shape of the cross section of the corner portion 3 perpendicular to its extending direction. For example, referring to FIG. 4, when the corner portion 3 is a right-angle corner portion 3, the shape of the cross section of the filling portion 4 perpendicular to its extending direction is substantially a right-angle triangle. A first right-angle side of the triangle coincides with the first circuit board 1, and the second right-angle side of the triangle coincides with the end surface line of the second circuit board 2, and the beveled edge of the triangle is connected between the first edge and the second edge.

Referring to FIG. 3, in this example embodiment, the side of the filling portion 4 away from the first circuit board 1 and away from the second circuit board 2 is a column surface. The column surface is recessed toward a side close to the corner portion 3. The column surface has a smooth transition with the first circuit board 1, and the column surface can also have a smooth transition with the second circuit board 2. That is, the beveled edge of the cross section of the filling portion 4 perpendicular to its extending direction is an arc. The arc is recessed toward the side close to the corner portion 3. The arc is tangential to the first circuit board 1, and the arc can also be tangential to the second circuit board 2. In this case, the column surface has a smooth transition with the first circuit board 1 and the column surface has a smooth transition with the second circuit board 2, which further prevents the electromagnetic shielding layer 5 from breaking at the joint of the filling portion 4 with the first circuit board 1 and at the joint of the filling portion 4 with the second circuit board 2.

In other example embodiments of the present disclosure, with reference to FIG. 5, the column surface may also protrude toward the side away from the corner portion 3. That is, the beveled edge of the cross section of the filling portion 4 perpendicular to its extending direction is an arc. The arc protrudes toward the side away from the corner portion 3. In this case, the filling portion 4 can also make the transition of the joint between the first circuit board 1 and the second circuit board 2 gentle, to avoid the electromagnetic shielding layer 5 from breaking due to the height difference between the first circuit board 1 and the second circuit board 2.

A length of an orthographic projection of the filling portion 4 on the first circuit board 1 in a first direction X is less than or equal to one-half of a length E of the first circuit board 1 in the first direction X. For example, the length of an orthographic projection of the filling portion 4 on the first circuit board 1 in a first direction X may be greater than or equal to 0.4 mm and less than or equal to 5 mm. Preferably, the length N of an orthographic projection of the filling portion 4 on the first circuit board 1 in a first direction X may be greater than or equal to 0.4 mm and less than or equal to 0.8 mm.

The width of the filling portion 4 in the second direction Y is equal to the width of the corner portion 3 in the second direction Y, so that the entire corner portion 3 can be filled.

A height of the filling portion 4 in a third direction Z is less than or equal to a distance between a first surface of the second circuit board 2 and a first surface of the first circuit board 1. The first surface of the first circuit board 1 is a surface with the filling portion 4 formed thereon. The first surface of the second circuit board 2 is parallel to the first surface of the first circuit board 1 and is a surface close to the filling portion 4. Specifically, the height of the filling portion 4 is less than or equal to the difference between the sum of the thickness of the second double-layer circuit board 23 and the thickness of the first adhesive layer 22 and the sum of the thickness of the adhesive layer 13 and the thickness of the insulating layer 14.

Figure 6:
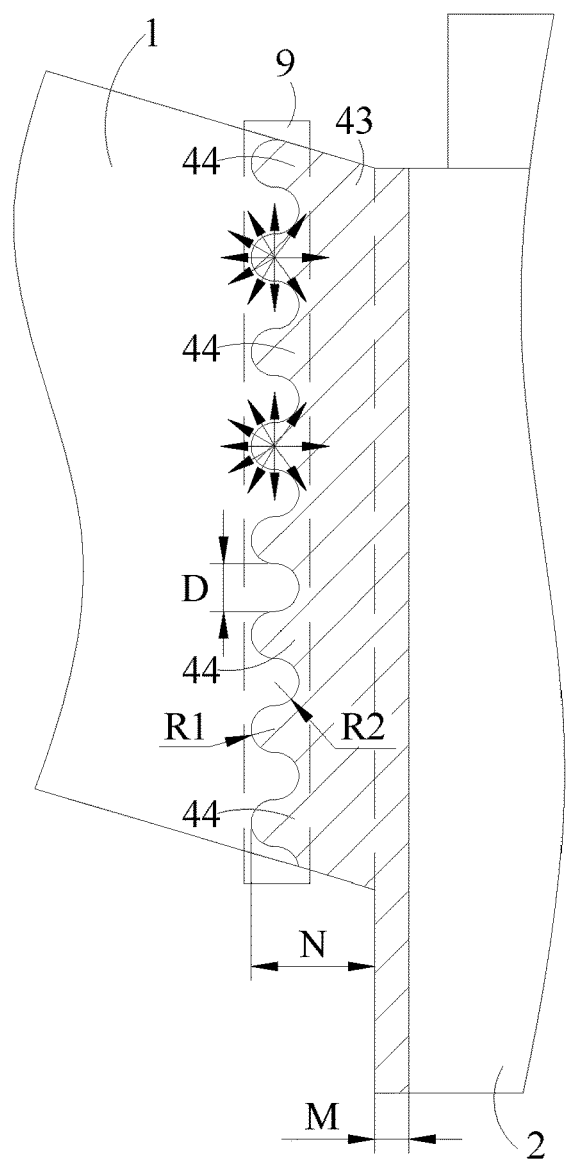
FIG. 6 is a partial structural schematic diagram of an example implementation of the circuit board structure in FIG. 2 with the electromagnetic shielding layer removed.
Figure 7:
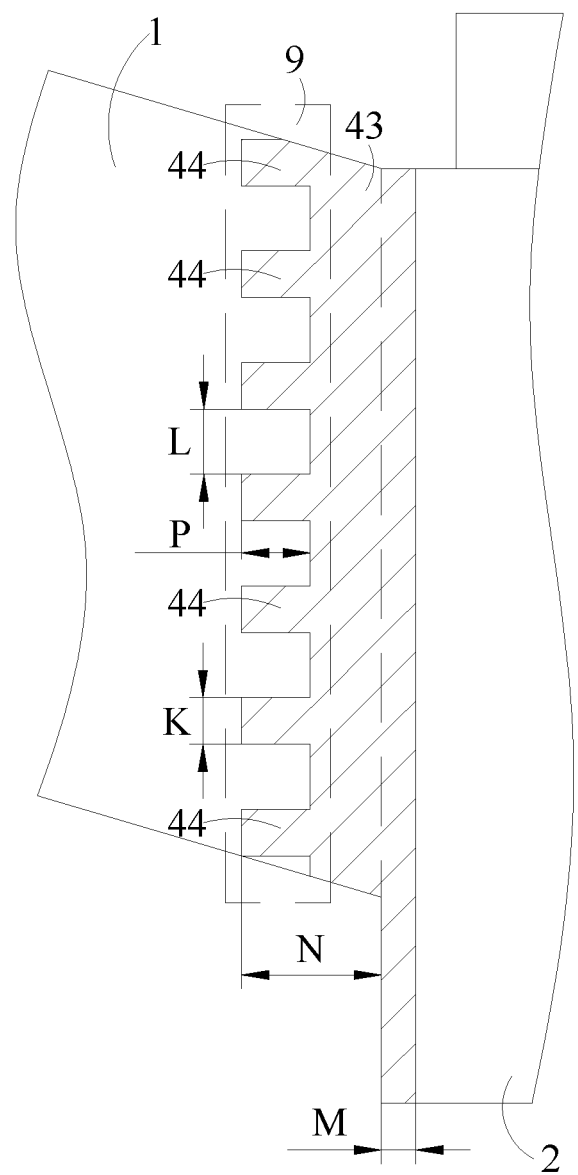
FIG. 7 is a partial structural schematic diagram of another example implementation of the circuit board structure in FIG. 2 with the electromagnetic shielding layer removed.
Figure 8:
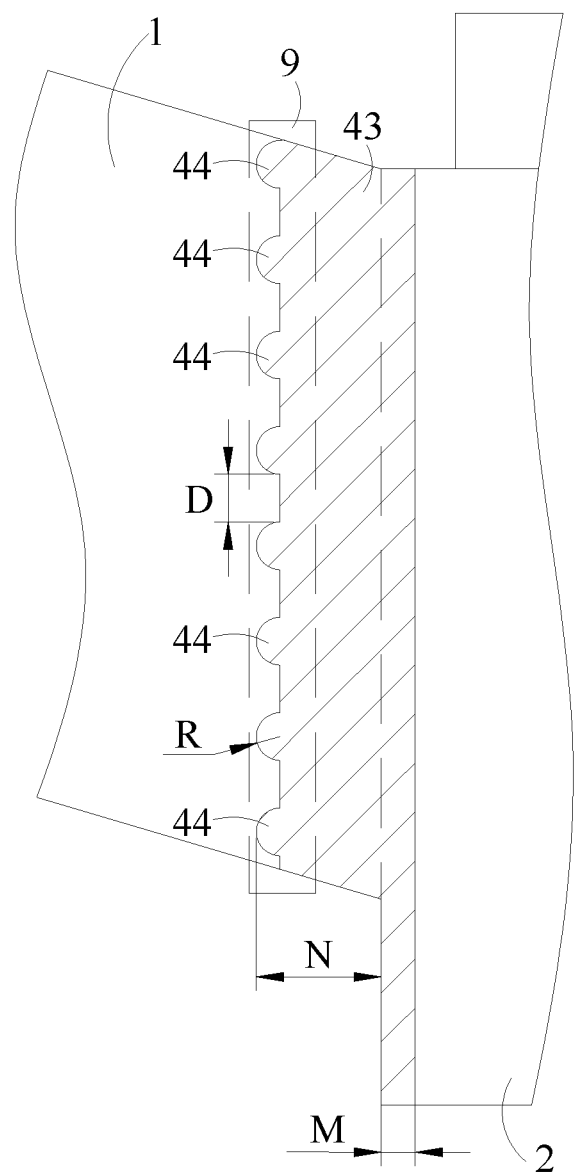
FIG. 8 is a partial structural schematic diagram of yet another example implementation of the circuit board structure in FIG. 2 with the electromagnetic shielding layer removed.

In some example embodiments of the present disclosure, with reference to FIGS. 6, 7 and 8, the first circuit board 1 has a bending area 9, such that a portion of the first circuit board 1 can be bent around the bending area 9 along the bending direction. The orthographic projection of the edge of the side of the filling portion 4 away from the second circuit board 2 on the first circuit board 1 is located in the bending area 9, and the orthographic projection of the edge on the first circuit board 1 is a curve.

It should be noted that in the present disclosure, the term "curve" is relative to a straight line, and as long as it is not a straight line, whether it is smooth or not, it is a "curve". That is, a curve can consist of at least one of a line segment and a smooth curve.

The filling portion 4 can include a filling portion body 43 and a plurality of protrusions 44. The plurality of protrusions 44 are successively arranged on a side of the filling portion body 43 away from the second circuit board 2. An orthographic projection of the protrusions 44 on the first circuit board 1 is located in the bending area 9. An orthographic projection of a side edge of the protrusions 44 away from the second circuit board 2 on the first circuit board 1 forms at least part of the curve. A gap is provided between adjacent two protrusions 44, and a length of each protrusion 44 in a second direction is identical.

Specifically, referring to FIG. 6, the curve formed by the orthographic projection of the edge of the side of the protrusions 44 away from the second circuit board 2 on the first circuit board 1 is constituted by a plurality of smooth curves connected sequentially, and the smooth curves may be semicircular arcs. That is, the edge of the side of the protrusion 44 away from the second circuit board 2 is composed of a plurality of circular arcs connected sequentially. A curve formed by the projection of the protrusion 44 can include a semicircular arc, two quarter circular arcs are tangentially connected at two sides of the semicircular arc, and the semicircular arc and quarter circular arc bend in opposite directions. The radius R1 of the semicircular arc and the radius R2 of the quarter circular arc can be the same, or different. However, the radiuses R1 of the plurality of semicircular arcs of the curve are the same, and the radiuses R2 of the plurality of quarter circular arcs of the curve are also the same, so that the widths of the protrusions 44 in the second direction are the same. The gap D between two adjacent protrusions 44 is also the same. The diameter 2*R1 of the semicircular arc is greater than or equal to 0.1 mm and less than or equal to 0.3 mm. The diameter 2*R2 of the quarter circular arc is greater than or equal to 0.1 mm and less than or equal to 0.3 mm.

In some other example implementations, the smooth curve may also be a shape such as a sine curve or a parabola.

The plurality of arrows at the protrusions 44 in FIG. 6 indicate the bending stress release direction of the protrusion 44 when the first circuit board 1 is bent. It can be seen from the figure that there is a gap between adjacent two protrusions 44, the stress can be released to the gap, and it provides space for stress release, which can greatly reduce the bending stress generated when the first circuit board 1 is bent, avoid transferring the bending stress to the electromagnetic shielding layer 5, and effectively solve the problem of breakage of the electromagnetic shielding layer 5 in the bending area 9. Moreover, a plurality of protrusions 44 are set in the same structure, and the gap between adjacent two protrusions 44 is also the same, so that the protrusions 44 release the bending stress evenly everywhere, which avoids uneven stress.

Referring to FIG. 7, the curve formed by the orthographic projection of the edge of the side of the filling portion 4 away from the second circuit board 2 on the first circuit board 1 is constituted by a plurality of line segments connected sequentially, and the curve is set as a rectangular serrated curve. That is, the orthographic projection of one protrusion 44 on the first circuit board 1 is a rectangle, and the orthographic projections of a plurality of protrusions 44 on the first circuit board 1 form a plurality of rectangles set at intervals. The width K of the plurality of rectangles in the second direction is the same. That is, the width K of the plurality of protrusions 44 in the second direction is the same. The interval L between two adjacent protrusions 44 and the width K of the protrusions 44 in the second direction may be the same, and may also be different. The width K of the protrusions 44 in the second direction may be greater than or equal to 0.1 mm and less than or equal to 0.3 mm. The interval L between the two adjacent protrusions 44 may be greater than or equal to 0.1 mm and less than or equal to 0.3 mm. The length P of the protrusions 44 in the first direction may be greater than or equal to 0.1 mm and less than or equal to 0.5 mm.

In some other example implementations, the curve can be provided as a triangular sawtooth curve, trapezoidal sawtooth curve, or other structures formed by a plurality of line segments connected sequentially.

Referring to FIG. 8, the curve formed by the orthographic projection of the edge of the side of the filling portion 4 away from the second board 2 on the first circuit board 1 consists of a plurality of line segments and a plurality of curves connected sequentially at intervals. The curve formed by the projection of a protrusion 44 may include a semicircular arc. The orthographic projections of a plurality of protrusions 44 on the first circuit board 1 form a plurality of semicircular arcs set at intervals. The radiuses R of the plurality of semicircular arcs are the same, so that the widths of the plurality of protrusions 44 in the second direction are the same, and the gap D between two adjacent protrusions 44 is also the same. However, the gap D between the two adjacent protrusions 44 and the diameter 2*R of the semicircular arc may be the same or different. The diameter 2*R of the semicircular arc is greater than or equal to 0.1 mm and less than or equal to 0.3 mm, and the gap D between the two adjacent protrusions 44 is greater than or equal to 0.1 mm and less than or equal to 0.3 mm.

In some other example implementations, the semicircular arc line may also be a shape such as a sine curve or a parabola.

Similarly, in the example implementations shown in FIGS. 7 and 8, the protrusion 44 can provides space for stress release when the first circuit board 1 is bent, which can greatly reduce the bending stress generated when the first circuit board 1 is bent, avoid transferring the bending stress to the electromagnetic shielding layer 5, and effectively solve the problem of breakage of the electromagnetic shielding layer 5 in the bending area 9.

The material of the filling portion 4 can be an insulating ink, for example, PSR (Photo-sensitive Solder Resistance). The filling portion 4 can be formed in the corner portion 3 by coating. The insulating ink has fluidity and can be well filled to the corner portion 3, and can form a certain curvature, i.e., forming the above-mentioned column surface. The insulating ink of the filling portion 4 can be printed simultaneously with the insulating ink of the component area. The coating amount of the insulation ink is about ½×B×G (C1+C2), wherein B is the width of the filling portion 4 or the width of the corner portion 3, G is the length of the filling portion 4, C1 is the height of one filling portion 4, and C2 is the height of another filling portion 4. In the case wherein there is only one filling portion 4, the value of C1 or C2 is zero. In an example implementation, the insulating ink is coated in a volume of about 5 mm³ and the amount is about 0.0045 g.

In addition, due to the limitations of the coating process, the insulating ink may also form a very thin layer at the end of the surface of the second circuit board 2 close to the first circuit board 1. Specifically, the width M of the portion of the filling portion 4 on the surface of the second circuit board 2 in the first direction is greater than or equal to 0.1 mm and less than or equal to 0.3 mm, and its thickness may be basically negligible.

The electromagnetic shielding layer 5 is set in two layers, and the two lays of the electromagnetic shielding layer 5 are set symmetrically. Each layer of the electromagnetic shielding layer 5 covers the first circuit board 1, the second circuit board 2 and the filling portion 4. As shown in FIG. 3, two layers of the electromagnetic shielding layer 5 are laminated with the filling portion 4 to form a column structure, making transition of the electromagnetic shielding layer 5 more gentle, and the filling portion 4 provides support for the electromagnetic shielding layer 5 to avoid the electromagnetic shielding layer 5 from breaking. The electromagnetic shielding layer 5 can play the role of electromagnetic shielding, thus ensuring the electromagnetic shielding performance.

Figure 9:
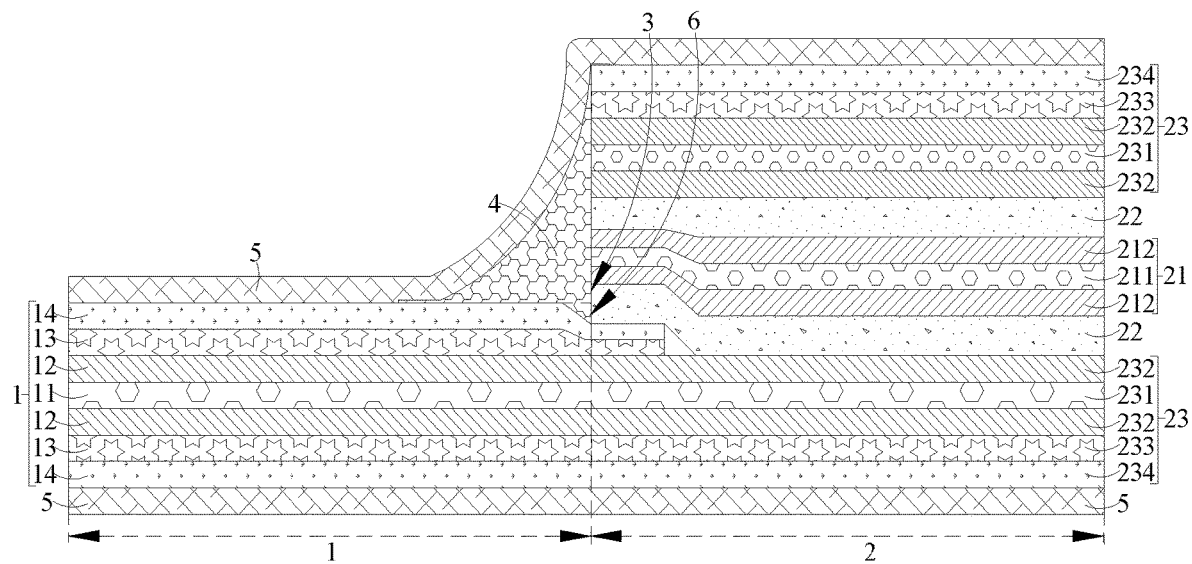
FIG. 9 is a structural schematic diagram of a second example embodiment of the circuit board structure after cutting along A-A in FIG. 2.
Figure 10:
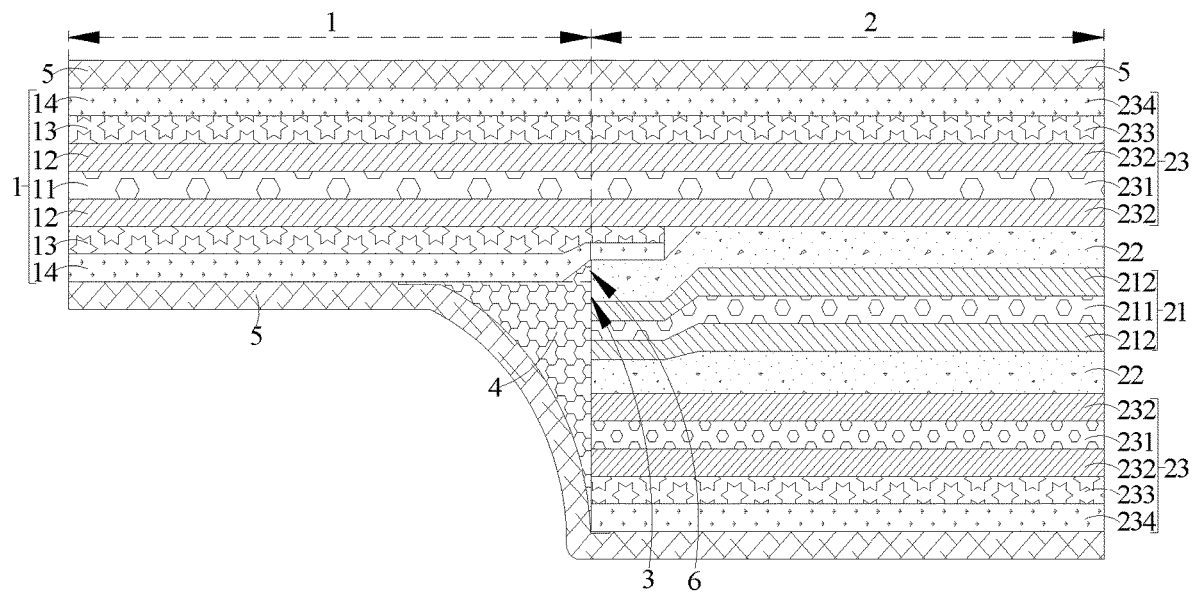
FIG. 10 is a structural schematic diagram of a third example embodiment of the circuit board structure after cutting along A-A in FIG. 2.

Referring to FIGS. 9 and 10, in the second and third example implementations of the present disclosure, two layers of the conductive layer 12 in the first circuit board 1 are provided in the same layer as two layers of the conductor layer in one of the second double-layer circuit boards 23 in one-to-one correspondence. That is, two layers of the conductive layer 12 in the first circuit board 1 are provided in the same layer as two layers of the conductor layer 232 in the second double-layer circuit board 23 located at one side of the first circuit board 1 in one-to-one correspondence, or the two layers of the conductive layer 12 in the first circuit board 1 are provided in the same layer as two layers of the conductor layer 232 in the second double-layer circuit board 23 located at the opposite side of the first circuit board 1 in one-to-one correspondence. The substrate layer 11 of the first circuit board 1 is also provided in the same layer as the second substrate layer 231 of one of the second double-layer circuit boards 23. The adhesive layer 13 on the side of the first circuit board 1 away from the corner portion 3 is also provided in the same layer as the third adhesive layer 233 of one of the second double-layer circuit boards 23. The insulating layer 14 on the side of the first circuit board 1 away from the corner portion 3 is also provided in the same layer as the first insulating cover layer 234 of one of the second double-layer circuit boards 23.

In this case, the joint between the first circuit board 1 and the second circuit board 2 is formed with a corner portion 3 on one side only, while the other side is formed as a flat surface. The corner portion 3 can be a right-angle corner portion 3, or can also be an obtuse-corner portion 3 or an acute-corner portion 3.

The end of the adhesive layer 13 of the first circuit board 1 close to the corner portion 3 close to the second circuit board 2 and the end of the insulating layer 14 of the first circuit board 1 close to the corner portion 3 close to the second circuit board 2 are located between the first adhesive layer 22 and the second double-layer circuit board 23. That is, the orthographic projection of the adhesive layer 13 of the first circuit board 1 close to the corner portion 3 on the substrate layer 11 and the orthographic projection of the insulating layer 14 of the first circuit board 1 close to the corner portion 3 on the substrate layer 11 overlap with the orthographic projection of the first adhesive layer 22 on the substrate layer 11. The width of the overlapping area is about 0.5 mm.

The adhesive layer 13 of the first circuit board 1 away from the corner portion 3 and a third adhesive layer 233 in the second double-layer circuit board 23 are provided in an identical layer and connected as a whole. The insulating layer 14 of the first circuit board 1 away from the corner portion 3 and a first insulating cover layer 234 of the second double-layer circuit board 23 are provided in an identical layer and connected as a whole.

In these two example implementations, similarly, since the insulating layer 14 and the adhesive layer 13 of the first circuit board 1 need to be formed between the first adhesive layer 22 and the second double-layer circuit board 23 by pressing, one recessed portion 6 is further formed at the corner of the corner portion 3 and close to a side of the first circuit board 1. The corner portion 3 also includes a recessed portion 6. The extending direction of the recessed portion 6 is the same as the extending direction of the corner portion 3, and the extension length of them two is the same. The cross-sectional shape of the recessed portion 6 perpendicular to its extending direction is basically triangular.

Since only one corner portion 3 is formed, only one filling portion 4 is required, and the height of the filling portion 4 is different from that in the first example implementation. The height of the filling portion 4 can be less than or equal to the difference between the sum of the thickness of two layers of the first adhesive layer 22, the thickness of the second double-layer circuit board 23 and the thickness of the first double-layer circuit board 21 and the sum of the thickness of the adhesive layer 13 and the thickness of the insulating layer 14. Since the height of the filling portion 4 is higher than the height of the filling portion 4 in the first example implementation, the width of the filling portion 4 can also be larger than the width of the filling portion 4 in the first example implementation. The shape and length of the filling portion 4 can be the same as the shape and length of the filling portion 4 in the first example implementation. The specific structure of the filling portion 4 has been explained in detail above, and will not be repeated here.

The electromagnetic shielding layer 5 is set in two layers, and the electromagnetic shielding layer 5 set on the side formed with the corner portion 3 and the filling portion 4 covers the first circuit board 1, the second circuit board 2 and the filling portion 4. As shown in FIGS. 9 and 10, the layer of electromagnetic shielding layer 5 is laminated with the filling portion 4 to form a column structure, making transition of the electromagnetic shielding layer 5 more gentle, and the filling portion 4 provides support for the electromagnetic shielding layer 5 to avoid the electromagnetic shielding layer 5 from breaking, thus ensuring the electromagnetic shielding performance. The electromagnetic shielding layer 5 set on the side without the corner portion 3 and the filling portion 4 covers the first circuit board 1 and the second circuit board 2, and the electromagnetic shielding layer 5 on this side is flat, without the risk of fracture. The electromagnetic shielding layer 5 can play the role of electromagnetic shielding.

Figure 11:
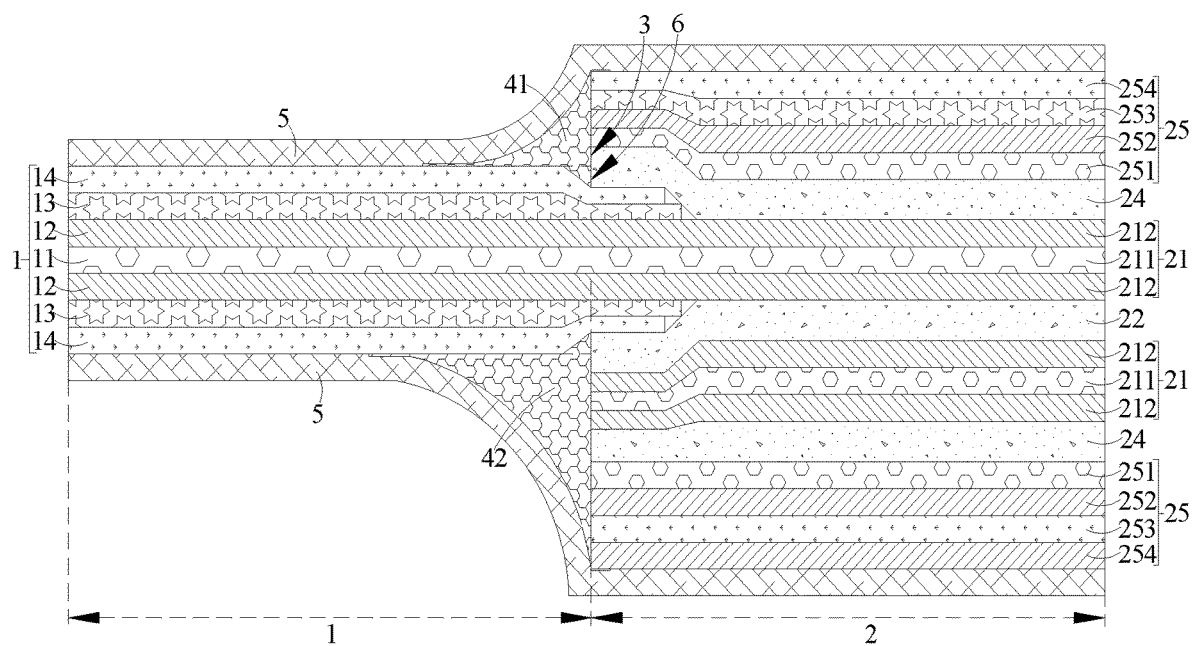
FIG. 11 is a structural schematic diagram of a fourth example embodiment of the circuit board structure after cutting along A-A in FIG. 2.
Figure 12:
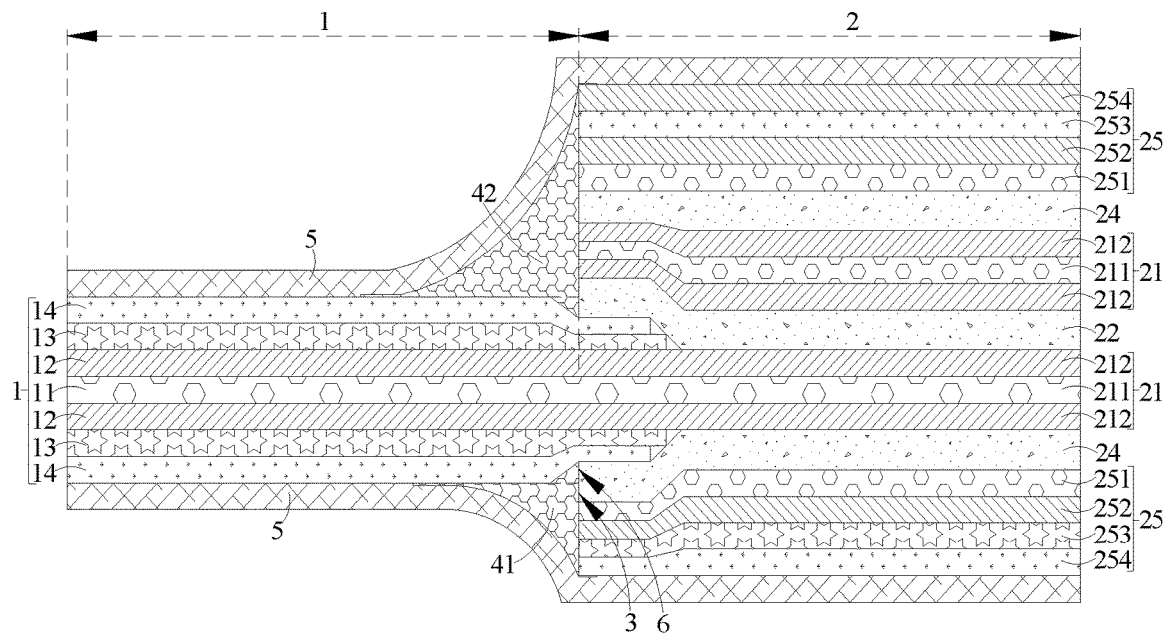
FIG. 12 is a structural schematic diagram of a fifth example embodiment of the circuit board structure after cutting along A-A in FIG. 2.

FIG. 11 and FIG. 12 shows the fourth and fifth example embodiments of the present disclosure.

The structure of the first circuit board 1 in these two example implementations is the same as the structure of the first circuit board 1 in the first, second, and third example implementations, and the specific structure of the first circuit board 1 has been described in detail above, so it will not be repeated here.

The second circuit board 2 can include a first double-layer circuit board 21, a first adhesive layer 22, a second adhesive layer 24 and a single-layer circuit board 25. The first double-layer circuit board 21 is laminatedly provided in two. The first adhesive layer 22 is bonded between the two first double-layer circuit boards 21. The second adhesive layer 24 is provided in two. The two second adhesive layers 24 are correspondingly provided on two sides of the first double-layer circuit board 21 away from the first adhesive layer 22. The single-layer circuit board 25 is symmetrically provided in two. The two single-layer circuit boards 25 are correspondingly provided on two sides of the second adhesive layer 24 away from the first adhesive layer 22. The second circuit board 2 is provided in a sequence of layers of the single-layer circuit board 25, the second adhesive layer 24, the first double-layer circuit board 21, the first adhesive layer 22, the first double-layer circuit board 21, the second adhesive layer 24, and the single-layer circuit board 25.

Specifically, the first double-layer circuit board 21 can include a first substrate layer 211 and two layers of first conductive layer 212. The first substrate layer 211 has a first surface and a second surface that are opposite. The two layers of first conductive layer 212 are laminated on opposite sides of the first substrate layer 211 in one-to-one correspondence. That is, one layer of first conductive layer 212 is provided on the first surface and one layer of first conductive layer 212 is also provided on the second surface. The two first double-layer circuit boards 21 of the two first conductive layers 212 close to each other are bonded by the first adhesive layer 22, to bond the two first double-layer circuit boards 21 together.

The single-layer circuit board 25 may include a third substrate layer 251, a third conductive layer 252, a fourth adhesive layer 253 and a second insulating cover layer 254. The third substrate layer 251 is bonded to the second adhesive layer 24, to bond the single-layer circuit board 25 and the first double-layer circuit board 21 together. The third conductive layer 252 is provided on a side of the third substrate layer 251 away from the first double-layer circuit board 21. The fourth adhesive layer 253 is provided on a side of the third conductive layer 252 away from the first double-layer circuit board 21. The second insulating cover layer 254 is provided on a side of the fourth adhesive layer 253 away from the first double-layer circuit board 21. That is, the second insulating cover layer 254 is bonded together with the third conductive layer 252 through the fourth adhesive layer 253.

The two layers of conductive layer 12 of the first double-layer circuit board 21 are provided in the same layer as the two layers of conductor layer in one of the first double-layer circuit boards 21 in one-to-one correspondence. Referring to FIG. 11, the two layer of conductive layer 12 of the first circuit board 1 are provided in the same layer as the two layers of first conductive layer 212 in one of the first double-layer circuit boards 21 in one-to-one correspondence. Referring to FIG. 12, the two layers of conductive layer 12 of the first circuit board 1 are provided in the same layer as the two layers of first conductive layer 212 in the opposite another of the first double-layer circuit boards 21 in one-to-one correspondence. These two cases are symmetrical to each other.

One end of one layer of the adhesive layers 13 of the first double-layer circuit board 21 close to the second circuit board 2 and one end of one layer of the insulating layers 14 of the first double-layer circuit board 21 close to the second circuit board 2 are located between the first adhesive layer 22 and the first double-layer circuit board 21.

One end of another layer of the adhesive layers 13 of the first double-layer circuit board 21 close to the second circuit board 2 and one end of another layer of the insulating layers 14 of the first double-layer circuit board 21 close to the second circuit board 2 are located between the second adhesive layer 24 and the first double-layer circuit board 21.

Two corner portions 3 are formed at the joint of the first circuit board 1 and the second circuit board 2, and the two corner portions 3 are located on opposite two sides of the first circuit board 1. Since the circuit boards located on opposite sides of the first double-layer circuit board 21 are not symmetrical, the two corner portions 3 are not symmetrical either. The two corner portions 3 can be right-angle corner portions, and can also be obtuse-angle corner portions or acute-angle corner portions.

Besides, since the insulating layer 14 and the adhesive layer 13 of the first circuit board 1 need to be formed between the first adhesive layer 22 and the first double-layer circuit board 21 by pressing, a recessed portion 6 is formed on the surface of the first circuit board 1 close to a corner portion 3 and close to the end of the second circuit board 2. The recessed portion 6 and the corner portion 3 are connected as a whole. That is, one recessed portion 6 is further formed at the corner of the corner portion 3 and close to a side of the first circuit board 1. The corner portion 3 also includes a recessed portion 6. The filling portion 4 fills in the corner portion 3 and the recessed portion 6. The extending direction of the recessed portion 6 is the same as the extending direction of the corner portion 3, and the extension length of them two is the same. The cross-sectional shape of the recessed portion 6 perpendicular to its extending direction is basically triangular, but the depth of the recessed portion 6 is small, which is about 20 um.

The corner portion 3 is filled with a filling portion 4, and the extending direction of the filling portion 4 is the same as the extending direction of the corner portion 3. The thickness of a cross section of the filling portion 4 perpendicular to the extending direction increases as a distance from the second circuit board 2 decreases.

It should be noted that the edge of the corner portion is the connection line of the first circuit board 1 and the second circuit board 2.

In the two example implementations, two corner portions 3 are provided, then two filling portions 4 are provided, and the two filling portions 4 are different. For the sake of illustration, the two filling portions 4 are referred to as the first filling portion 41 and the second filling portion 42, respectively. The first filling portion 41 is the filling portion opposite to the single-layer circuit board 25. The second filling portion 42 is the filling portion opposite to the single-layer circuit board 25 and the first double-layer circuit board 21. The first filling portion 41 can include a filling portion body 43 and a plurality of protrusions 44. The second filling portion 42 can also include a filling portion body 43 and a plurality of protrusions 44. The specific structure of the plurality of protrusions 44 has been described in detail above, so it will not be repeated here.

Referring to FIG. 11, the cross-sectional shape of the first filling portion 41 is substantially the same as that in the first example implementation, so it will not be repeated here. The main difference between the first filling portion 41 and the filling portion 4 in the first example implementation is in that the height of the first filling portion 41 is smaller, and the height of the first filling portion 41 is less than or equal to the difference between the sum of the thickness of the second adhesive layer 24 and the thickness of the single-layer circuit board 25 and the sum of the thickness of the adhesive layer 13 and the thickness of the insulating layer 14. The length of the first filling portion 41 is also small.

The cross-sectional shape of the second filling portion 42 is substantially the same as that in the first example implementation, so it is not repeated here. The main difference between the second filling portion 42 and the filling portion 4 of the first example implementation is in that the height of the second filling portion 42 is larger, and the height of the second filling portion 42 is less than or equal to the difference between the sum of the thickness of the second adhesive layer 24, the thickness of the first adhesive layer 22, the thickness of the first double-layer circuit board 21 and the thickness of the single-layer circuit board 25 and the sum of the thickness of the adhesive layer 13 and the thickness of the insulating layer 14. The length of the first filling portion 41 is also large.

Referring to FIG. 12, the structure of the first filling portion 41 in this example implementation is the same as the structure of the second filling portion 42 in FIG. 11, and the structure of the second filling portion 42 in this example implementation is the same as the structure of the first filling portion 41 in FIG. 22, so it is not repeated here.

The electromagnetic shielding layer 5 is provided in two layers, each layer of electromagnetic shielding layer 5 covers the first circuit board 1, the second circuit board 2 and the filling portion 4. As shown in FIGS. 11 and 12, two layers of the electromagnetic shielding layer 5 are laminated with the filling portion 4 to form a column structure, making transition of the electromagnetic shielding layer 5 more gentle, and the filling portion 4 provides support for the electromagnetic shielding layer 5 to avoid the electromagnetic shielding layer 5 from breaking. The electromagnetic shielding layer 5 can be a shielding layer, and play the role of electromagnetic shielding, thus ensuring the electromagnetic shielding performance.

The material of the substrate layer 11, the material of the first substrate layer 211, the material of the second substrate layer 231, the material of the third substrate layer 251, the material of the first insulating cover layer 234, and the material of the second insulating cover layer 254 may be PI (polyimide).

The material of the conductive layer 12, the material of the first conductive layer 212, the material of the second conductive layer 232 and the material of the third conductive layer 252 may be copper, or may be other conductive materials, for example, silver, gold, aluminum and the like.

The material of the first adhesive layer 22 and the second adhesive layer 24 can be a semi-cured sheet (Pre-preg), which is mainly used as an adhesive material and insulating material for the inner conductive pattern of the multilayer printed board. After the semi-cured sheet is laminated, the semi-cured epoxy resin is extruded and begins to flow and solidify, bonding the multilayer boards together and forming a reliable layer of insulator.

The material of the third adhesive layer 233 and the material of the fourth adhesive layer can be ADH (Adhesive) adhesive.

It should be noted that there is a binding area 7 provided on one side of this second circuit board, and the binding area 7 can be bound to the display panel. There are also a plurality of component areas 8 provided on one side of the second circuit board. A variety of components are provided in the component area 8. The components can include the main control driver chip, various connectors, and so on. A BTB connector is provided on one side of the first circuit board.

In the circuit board structure of the present disclosure, since a thickness of the second circuit board is greater than that of the first circuit board, at least one corner portion forms at a joint of the first circuit board and the second circuit board. A filling portion fills in the corner portion. A thickness of a cross section of the filling portion perpendicular to its extending direction increases as a distance from the second circuit board decreases. Therefore, the transition between the first circuit board and the second circuit board is gentle. That is, the filling portion forms a transition bridge, making the electromagnetic shielding layer covering the first circuit board, the second circuit board and the filling portion gentle, and the filling portion provides support for the electromagnetic shielding layer, avoiding the electromagnetic shielding layer from breaking due to the height difference, thus ensuring the electromagnetic shielding performance.

Further, the present disclosure example implementation also provides a display device. The display device can include any of the above-mentioned circuit board structures. The specific structure of the circuit board structure has been described in detail above, therefore, here will not repeat.

The specific type of display device is not particularly limited, the display device types commonly used in the field can be used, for example, cell phones and other mobile devices, watches and other wearable devices, VR devices, etc. Those skilled in the art can select accordingly based on the specific use of the display device, which will not be repeated here.

It should be noted that the display device also includes a display panel, and the display panel is bound together with the above circuit board structure. In addition to the display panel, the display device also includes other necessary parts and components. For example, a display may include a housing, circuit boards, power lines, and so on. Those skilled in the art can add accordingly according to the specific use requirements of the display device, which will not be described here.

Compared with the prior art, the beneficial effects of the display device provided by the example embodiment of the present disclosure are the same as the beneficial effects of the circuit board structure provided by the above example embodiment, which will not be repeated here.

Other embodiments of the present disclosure will readily occur to those skilled in the art upon consideration of the specification and practice of the disclosure disclosed herein. This disclosure is intended to cover any variations, uses, or adaptations of this disclosure that follow the general principles of this disclosure and include common general knowledge or conventional technical means in the technical field not disclosed by this disclosure. The specification and embodiments are to be regarded as exemplary only, with the true scope and spirit of the disclosure being indicated by the appended claims.

What is claimed is:

1. A circuit board structure, comprising:
    a first circuit board;
    a second circuit board, connected to the first circuit board, wherein a thickness of the second circuit board is greater than that of the first circuit board, at least one corner portion forms at a joint of the first circuit board and the second circuit board, a connection line forms at a joint of the second circuit board and the first circuit board, the connection line is located at the corner portion;
    a filling portion, filling in the corner portion, wherein an extending direction of the filling portion is identical to an extending direction of the corner portion, the extending direction is identical to a direction of the connection line, a thickness of a cross section of the filling portion perpendicular to the extending direction increases as a distance from the second circuit board decreases; and an electromagnetic shielding layer, covering the first circuit board, the second circuit board and the filling portion, wherein a width of an orthographic projection of the filling portion on the first circuit board in a first direction is less than or equal to one-half of a width of the first circuit board in the first direction.

2. The circuit board structure according to claim 1, wherein a side of the filling portion away from the first circuit board and away from the second circuit board is a column surface, the column surface is recessed toward a side close to the corner portion, smooth transition exists between the column surface and the first circuit board.

3. The circuit board structure according to claim 1, wherein a length of the filling portion in a second direction is equal to a length of the corner portion in the second direction, a height of the filling portion in a third direction is less than or equal to a distance between a first surface of the second circuit board and a first surface of the first circuit board, the first surface of the first circuit board is a surface with the filling portion formed thereon, the first surface of the second circuit board is parallel to the first surface of the first circuit board and is a surface close to the filling portion, the first direction, the second direction and the third direction are perpendicular to each other.

4. The circuit board structure according to claim 1, wherein a recessed portion exists on a surface of the first circuit board with the corner portion formed thereon and close to an end of the second circuit board, the recessed portion is connected with the corner portion, the filling portion fills the corner portion and the recessed portion.

5. The circuit board structure according to claim 1, wherein the first circuit board has a bending area, wherein an orthographic projection of a side edge of the filling portion away from the second circuit board on the first circuit board is located in the bending area, and the orthographic projection of the edge on the first circuit board is a curve.

6. The circuit board structure according to claim 5, wherein the curve comprises at least one of a line segment and a smooth curve.

7. The circuit board structure according to claim 5, wherein the filling portion comprises:

a filling portion body;

a plurality of protrusions, successively arranged on a side of the filling portion body away from the second circuit board, an orthographic projection of the protrusions on the first circuit board is located in the bending area, an orthographic projection of a side edge of the protrusions away from the second circuit board on the first circuit board forms at least part of the curve, a gap is provided between adjacent two protrusions, a width of each protrusion in a second direction is identical.

8. The circuit board structure according to claim 1, wherein material of the filling portion is insulating ink.

9. The circuit board structure according to claim 1, wherein the first circuit board is a double-layer board, the first circuit board comprises:

a substrate layer;

two conductive layers, correspondingly laminated on opposite two sides of the substrate layer;

an adhesive layer, provided in two layers, the two adhesive layers correspondingly provided on two sides of the conductive layer away from the substrate layer;

an insulating layer, provided in two layers, the two insulating layers correspondingly provided on two sides of the adhesive layer away from the substrate layer.

10. The circuit board structure according to claim 9, wherein the second circuit board comprises:

a first double-layer circuit board;

two first adhesive layers, correspondingly laminated on opposite two sides of the first double-layer circuit board;

a second double-layer circuit board, symmetrically provided in two, the two second double-layer circuit boards correspondingly provided on two sides of the first adhesive layer away from the first double-layer circuit board.

11. The circuit board structure according to claim 10, wherein the two conductive layers are correspondingly provided in an identical layer with two conductor layers in the first double-layer circuit board, the corner portion and the filling portion are provided in two.

12. The circuit board structure according to claim 11, wherein an end of the adhesive layer close to the second circuit board and an end of the insulating layer close to the second circuit board are located between the first adhesive layer and the first double-layer circuit board.

13. The circuit board structure according to claim 10, wherein the two conductive layers are correspondingly provided in an identical layer with two conductor layers in one of the second double-layer circuit boards, the corner portion and the filling portion are provided in one.

14. The circuit board structure according to claim 13, wherein a first end of the adhesive layer and a first end of the insulating layer are located between the first adhesive layer and the second double-layer circuit board, the first end of the adhesive layer is an end close to the corner portion and close to the second circuit board, the first end of the insulating layer is an end close to the corner portion and close to the second circuit board, the adhesive layer away from the corner portion and a third adhesive layer in the second double-layer circuit board are provided in an identical layer and connected as a whole, and the insulating layer away from the corner portion and a first insulating cover layer of the second double-layer circuit board are provided in an identical layer and connected as a whole.

15. The circuit board structure according to claim 10, wherein the first double-layer circuit board comprises:

a first substrate layer;

two first conductive layers, correspondingly laminated on opposite two sides of the first substrate layer.

16. The circuit board structure according to claim 9, wherein the second circuit board comprises:

a first double-layer circuit board, laminatedly provided in two;

a first adhesive layer, bonded between the two first double-layer circuit boards;

a second adhesive layer, provided in two, the two second adhesive layers correspondingly provided on two sides of the first double-layer circuit board away from the first adhesive layer;

a single-layer circuit board, symmetrically provided in two, the two single-layer circuit boards correspondingly provided on two sides of the second adhesive layer away from the first adhesive layer.

17. The circuit board structure according to claim 16, wherein the two conductive layers are correspondingly provided in an identical layer with two conductor layers in one of the first double-layer circuit boards, the corner portion and the filling portion are provided in two.

18. The circuit board structure according to claim 17, wherein one end of one of the adhesive layers close to the second circuit board and one end of one of the insulating layers close to the second circuit board are located between the first adhesive layer and the first double-layer circuit board, and one end of another one of the adhesive layers close to the second circuit board and one end of another one of the insulating layers close to the second circuit board are located between the second adhesive layer and the first double-layer circuit board.

19. The circuit board structure according to claim 16, wherein the single-layer circuit board comprises:
- a third substrate layer, bonded to the second adhesive layer;
- a third conductive layer, provided on a side of the third substrate layer away from the first double-layer circuit board;
- a fourth adhesive layer, provided on a side of the third conductive layer away from the first double-layer circuit board;
- a second insulating cover layer, provided on a side of the fourth adhesive layer away from the first double-layer circuit board.

20. A display device, comprising a circuit board structure, wherein the circuit board structure comprises:
- a first circuit board;
- a second circuit board, connected to the first circuit board, wherein a thickness of the second circuit board is greater than that of the first circuit board, at least one corner portion forms at a joint of the first circuit board and the second circuit board, a connection line forms at a joint of the second circuit board and the first circuit board, the connection line is located at the corner portion;
- a filling portion, filling in the corner portion, wherein an extending direction of the filling portion is identical to an extending direction of the corner portion, the extending direction is identical to a direction of the connection line, a thickness of a cross section of the filling portion perpendicular to the extending direction increases as a distance from the second circuit board decreases; and
- an electromagnetic shielding layer, covering the first circuit board, the second circuit board and the filling portion,
- wherein a width of an orthographic projection of the filling portion on the first circuit board in a first direction is less than or equal to one-half of a width of the first circuit board in the first direction.

\* \* \* \* \*